Nov. 2, 1965 R. LA ROSA 3,215,941
TRAVELING-WAVE PARAMETRIC AMPLIFIER WITH IDLER FREQUENCY MUCH HIGHER THAN SIGNAL FREQUENCY AND PROPAGATING ON SAME LINE THEREWITH
Filed July 13, 1960 2 Sheets-Sheet 1

Nov. 2, 1965 R. LA ROSA 3,215,941

TRAVELING-WAVE PARAMETRIC AMPLIFIER WITH IDLER FREQUENCY MUCH HIGHER THAN SIGNAL FREQUENCY AND PROPAGATING ON SAME LINE THEREWITH

Filed July 13, 1960

2 Sheets-Sheet 2

United States Patent Office 3,215,941
Patented Nov. 2, 1965

3,215,941

TRAVELING-WAVE PARAMETRIC AMPLIFIER WITH IDLER FREQUENCY MUCH HIGHER THAN SIGNAL FREQUENCY AND PROPAGATING ON SAME LINE THEREWITH

Richard La Rosa, South Hempstead, N.Y., assignor to Hazeltine Research, Inc., a corporation of Illinois Filed July 13, 1960, Ser. No. 42,681
5 Claims. (Cl. 330—4.6)

This invention relates to parametric amplifiers and, more particularly, to a new traveling-wave parametric amplifier allowing operation with an idler frequency much greater than the frequency of the signal to be amplified. As used in this specification, the term "pump signal" refers to an alternating current signal which supplies the energy required to allow amplification in a variable reactance amplifier. Also, "idler signal" refers to a signal at a frequency equal to the difference between the pump and input signal frequencies. The term "much greater" is relied upon to indicate differences between signal and idler frequencies of such magnitude that the two signals could not be efficiently propagated down one line in, for example, a prior art traveling-wave parametric amplifier using variable capacitance diodes as parametric elements. The reasons for this inability will be brought out below. A numerical example discussed below concerns the application of the invention to an amplifier designed to amplify signals in a range from 406–450 megacycles and an idler frequency range of 1394–1350 megacycles. Thus, in this example, the idler frequencies are at least three times as great as the signal frequencies. While no precise definition is possible, the idler frequency range will lie above the input signal frequency range and the idler frequencies will generally be at least two times as great as the signal frequencies (i.e., a ratio of idler to input signal frequencies of 2:1 or greater is desirable).

It is known that in a device such as a traveling-wave parametric amplifier achieving negative resistance amplification, it is necessary to produce power at the idler frequency if a net positive amount of power is to be produced at the input signal frequency. This idler frequency power must be delivered to some load, the characteristics of which directly influence the over-all noise figure achievable. This load may comprise the idler input or output terminations, or the combination of these terminations, depending on which have resistive characteristics. The resulting noise factor can be approximately described by the following equation:

$$F=1+\left(\frac{f_1}{f_2}\cdot\frac{T_2}{T_1}\right)$$

wherein $f_1$=input signal frequency,
$f_2$=idler frequency,
$T_1$=290° Kelvin, and
$T_2$=the noise temperature of the idler load.

Referring to this equation, it will be seen that a low noise factor may be achieved by refrigerating the idler termination or otherwise reducing its noise temperature, or by making the idler frequency substantially greater than the input signal frequency, or by combinations of such schemes. Refrigeration must be to a temperature approaching that of liquid oxygen or nitrogen to be of real value and in practice it is desirable to avoid the burden of apparatus required to achieve such refrigeration. The fact that low noise can be achieved by a proper relationship of the frequencies involved has been recognized by workers in the art but, until now, practical operation under such conditions has been considered unobtainable.

It is an object of this invention, therefore, to provide a traveling-wave parametric amplifier allowing efficient operation with an idler frequency much greater than the input signal frequency.

It is a further object of this invention to provide a traveling-wave parametric amplifier allowing efficient operation with an idler frequency much greater than the input signal frequency and utilizing effectively one transmission path propagating both the input and idler frequencies.

In accordance with the invention, a traveling-wave parametric amplifier adapted to operate with an idler frequency much greater than the input signal frequency comprises input means for accepting input signals to be amplified and for terminating idler signals, a plurality of devices each having a reactance whose magnitude may be varied about a fixed value, a plurality of phase-shift means coupling the devices in cascade with the input means for providing desired phase-shifts at both signal and idler frequencies, a plurality of reactive means coupled to the devices for compensating for the fixed value of reactance at both signal and idler frequencies, output means coupled to the opposite end of the cascade arrangement from the input means for making available amplified input signals, and pump means coupled to the device for supplying pump signals.

For a better understanding of the present invention, together with other and further objects thereof, reference is had to the following description taken in connection with the accompanying drawings, and its scope will be pointed out in the appended claims.

Figure 3A:
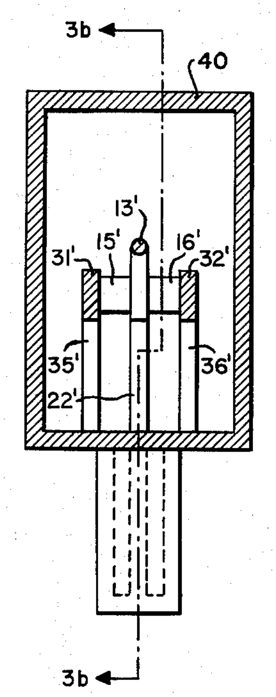
Figure 3B:
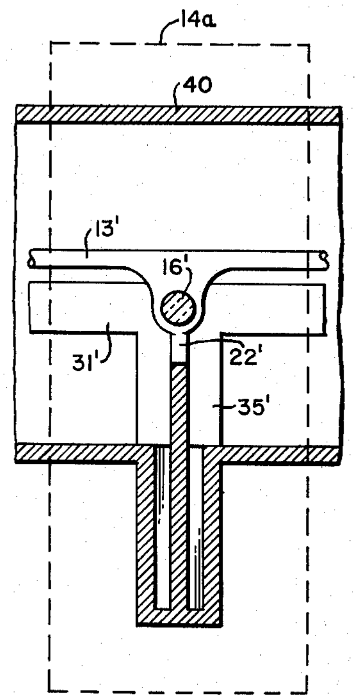

FIGS. 3*a* and 3*b* comprise two views of an actual physical arrangement of a stage of a traveling-wave parametric amplifier utilizing the invention.

Figure 1:
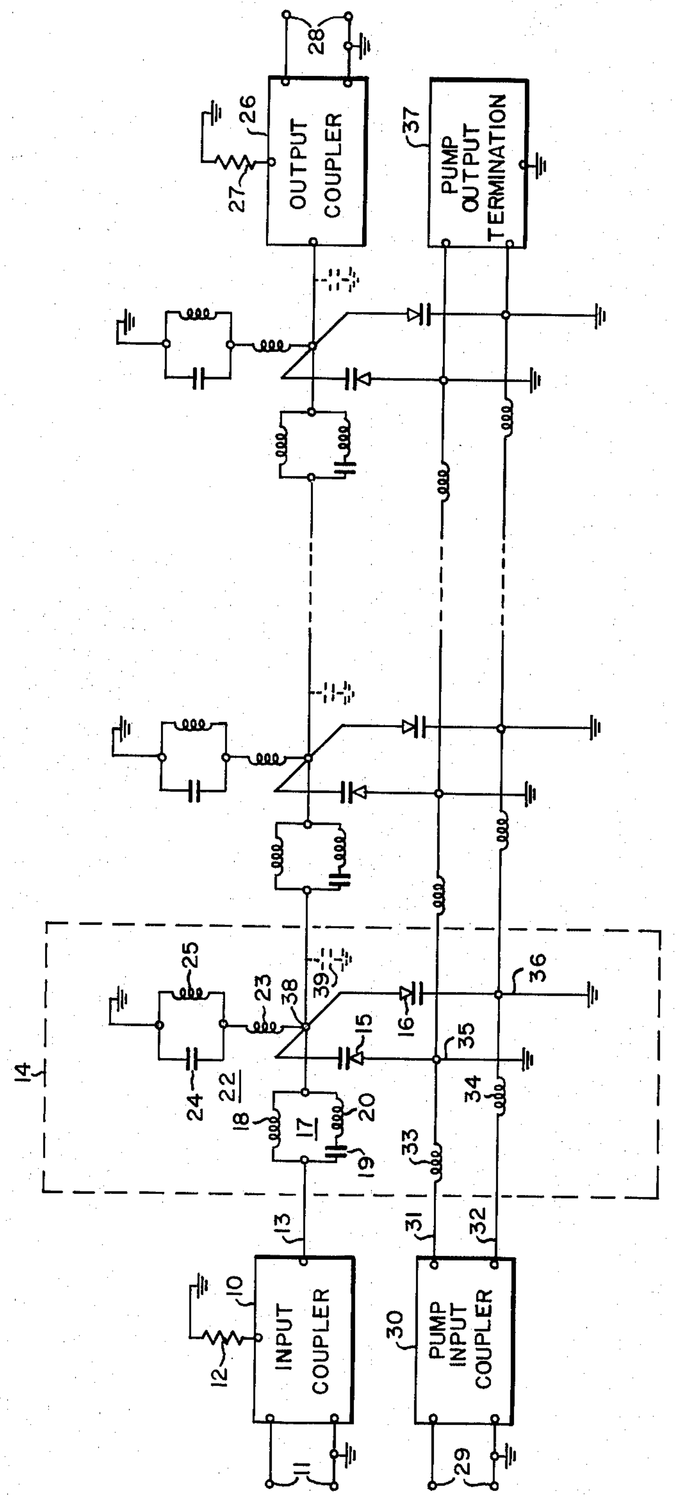
FIG. 1 is a schematic diagram of a traveling-wave parametric amplifier embodying the present invention.

Referring now to FIG. 1 of the drawing, there is shown a traveling-wave parametric amplifier adapted to operate with an idler frequency much greater than the input signal frequency. As illustrated, this amplifier comprises input means for accepting input signals to be amplified and for terminating idler signals, shown as input coupler 10 having signal input terminals 11, idler signal termination 12 and output conductor 13. The amplifier also includes a plurality of amplifier stages of similar configuration, the first such stage being labeled 14. This individual stage 14 includes two devices each having a reactance whose magnitude may be varied about a fixed value, shown as variable capacitance diodes 15 and 16. This stage also includes phase-shift means 17 which couple the respective pairs of devices of each stage in cascade with the input coupler 10. Phase-shift means 17 is shown as being made up of inductance 18 in parallel with the series combination of capacitance 19 and inductance 20. The stage also includes reactive means for compensating for the fixed value of reactance of the diodes 15 and 16 shown as circuit 22. As shown, circuit 22 includes an inductance 23 in series with the parallel combination of capacitor 24 and inductance 25.

The amplifier further includes output means coupled to the opposite end of the cascade arrangement from the input means shown as output coupler 26 having an idler termination 27 and amplified input signal output terminals 28. The amplifier finally includes pump means coupled to the diodes for supplying pump signals in push-pull series arrangement. These pump means comprise pump signal input terminals 29, pump input coupler 30, and two pump signal conductors 31 and 32 shown as including inductances 33 and 34, respectively, and supported by tuned stubs 35 and 36, respectively.

The general concepts and theory of operation of traveling-wave parametric amplifiers are well known in the art, and will, therefore, not be considered in detail herein. In operation, pump signals supplied to terminals 29 are coupled through coupler 30 to conductors 31 and 32. Coupler 30 may be in the form of a transformer for isolating the pump signals from ground and means for supplying a D.-C. bias to the conductors 31 and 32. The inductances 33 and 34 give the high-frequency pump signals a predetermined phase shift as the signals travel along the conductors from amplifier stage to amplifier stage. The stubs 35 and 36 are constructed so as to provide a relatively high impedance at the pump frequency, but a relatively low impedance at the input signal and idler frequencies. The pump signals can be considered as operating on the two variable capacitance diodes of each amplifier stage in simple push-pull arrangement so as to continuously vary the capacitances of the diodes in the amplifier. The pump signals are almost completely unaffected by the various connections to the point 38 and the pump signals and the means for supplying them need not be discussed further except to point out that the pump output termination 37 may be made up of a simple resistive coupling between the two pump conductors arranged to allow the D.-C. biasing circuit to be completed.

In the following description, it may help to have in mind actual relationships of the several frequencies which might be involved in the operation of such an amplifier. For this example, let it be assumed that it is desired to amplify input signals in a range from 406–450 megacycles (per second). If a pump frequency of 1800 megacycles is chosen, the resulting idler frequency range will be from 1394–1350 megacycles. It should be appreciated that while the present object is to amplify the signals in the 406–450 megacycle range and couple these amplified signals to some utilization circuit, provision must be made for efficiently propagating the idler signals inherently produced in the amplifier. (In other applications, it may be desirable to beneficially utilize the idler signals produced.) If within the signal ranges given, we examine a particular input signal at 425 megacycles, for example, the result will be an idler signal at 1375 megacycles. Referring to the required phase shifts previously mentioned, if an input signal frequency phase shift between diode pairs of 30° is chosen, then the required idler signal frequency phase shift will be approximately 100° and the pump signal frequency phase shift required will be approximately 130° for the frequencies chosen. Since, as stated, the pump signal conductors are substantially independent of the input and idler signal paths, the proper propagation characteristics for the pump signals are relatively easily provided for through proper design of the pump means.

The principal problem arises in attempting to provide an efficient path allowing amplification and propagation of the widely separated input and idler signal frequencies. The main cause of this problem is the relatively low impedance resulting from the fixed capacities of the variable capacitance diodes connected effectively between the transmission path and ground (the tuned stubs 35 and 36 are effectively shorted at signal and idler frequencies). In the interests of simplicity, the problem can be divided into two interrelated problems: first, the difficulty in providing for propagation of the frequencies required with the proper phase shifts; and second, the necessity for having the impedance level of the propagation path high enough to allow useful amplification per stage. (The amplification per stage is related to the actual change in capacitance of the diodes and the impedance levels of the circuits to which the diodes are connected.) In a simplified analysis, circuit 22 can be thought of as mainly directed to the second part of the problem and circuits 17 and 22 together are concerned with the first part (phase shifts).

Figure 2:
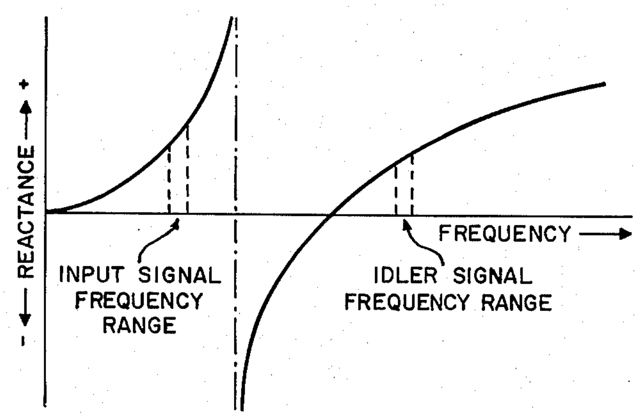
FIG. 2 is a reactance diagram useful in describing the invention.

With reference to FIG. 1, input signals to the amplifier are supplied to terminals 11 of input coupler 10. These signals are coupled to conductor 13 substantially without change. Coupler 10 may include impedance matching means and an idler signal separation filter as will be explained below. While conductor 13 and the other conductors are shown as simple wires, they may, in fact, takes the form of wave guide or other means suitable for carrying the signals. The variable capacitance diodes 15 and 16 have capacitances which are continuously varied about a fixed capacitance by the pump signals, as previously discussed. Circuit 22 is a simple example of reactive means in accordance with the invention, which may be provided for compensating for the fixed value of the diode capacitances at both signal and idler frequencies. Referring now to FIG. 2, there is represented the variation of impedance with frequency for circuit 22. Thus, it will be seen that circuit 22 has been designed to provide desired inductive reactances over both the input and idler signal frequency ranges. This characteristic is effective to substantially tune out the fixed capacity of the diodes at both signal and idler frequencies, thereby eliminating the undesired low impedance effect of these diodes on conductor 13 and the propagation path extending therefrom. This propagation path includes the circuits 22 in each stage and the conductors coupling the points 38 of each stage in cascade, thereby allowing input and idler signals to be propagated along the amplifier. Dotted capacitor 39 indicates stray capacitances coupled to this propagation path. These capacitances are also taken into consideration in the design of circuit 22.

Circuit 17 is a simple embodiment of phase-shift means in accordance with the invention for coupling the diode pairs, as illustrated, in cascade. These phase-shift means also may have a variation of impedance with frequency substantially as shown in FIG. 2 and are effective to provide the proper phase shift over both the input and idler signal frequency ranges. Stray capacitances are also taken into consideration in the design of this circuit.

With these circuits properly designed and proper pump signals supplied, the parametric amplification process takes place in the manner well known in the prior art. Input signals amplified by stage 14 and idler signals produced therein arrive with proper phasing in relation to the pump signals at the next amplifier stage and the process is repeated for the remaining stages of the amplifier. Finally, both the input and idler signals are coupled to output coupler 26. The coupler 26 may include filter means for separating the idler and amplified input signals. The amplified input signals, after transformation to provide the proper impedance level if this is required, appear at output terminals 28 for utilization as desired. The idler signals, after separation from the amplified input signals, are dissipated in resistor 27 or other dissipative means, or alternately may be coupled out for further processing to recover signal information.

The idler signals, as they are produced, are also propagated so as to arrive at input coupler 10. The termination of these idler signals is the primary source of the undesirable noise that was discussed at the beginning of this specification. With reference to the equation and the representative frequencies previously quoted, it will be seen that with an input signal of 425 megacycles and a resulting idler signal of 1375 megacycles, a theoretical noise figure of approximately 1.3 db results if resistor 12 is at room temperature. This noise figure compares favorably with that achievable in a degenerate traveling-wave parametric amplifier by maintaining the idler termination resistor 12 at the temperature of liquid nitrogen. This termination need not be a resistor as shown—other known types of dissipative means are applicable.

It will be appreciated that while the components of the various circuits have been illustrated as conventional coils and capacitors, such circuits might actually use straight wires as inductances and inherent parasitic capacitances to form desired reactive networks.

An arrangement is shown in FIG. 3 which utilizes the present invention to a more limited degree than the FIG. 1 amplifier. The primed reference numerals denote parts which correspond generally to the components in FIG. 1 bearing similar unprimed numerals. Thus, the reactive means 22 of FIG. 1 becomes a piece of straight transmission line 22' shorted at the end, whose characteristic impedance and length are adjusted to provide the proper impedances at both signal and idler frequencies. The variable reactance devices 15' and 16' are shown as pill-type diodes and the pump conductors 31' and 32' are relatively heavy bars relying upon distributed reactances to provide the proper phase shifts and supported by the stubs 35' and 36'. In FIG. 3, 40 represents a conductive shielding structure maintained at the reference potential.

Both types of reactive circuits, in accordance with the invention, are shown as being made up of lumped circuit elements, in the FIG. 1 arrangement (circuits 17 and 22); such circuit elements are not directly identifiable in the FIG. 3 arrangement. In FIG. 3 the stub or transmission line section 22' provides the function of circuit 22 of FIG. 1. While means 22' does provide reactances substantially as shown in FIG. 2, the characteristics of this section are such that many additional resonances exist rather than the single reactance pole and reactance zero as shown in FIG. 2. In FIG. 3 the input and idler signal conductor 13' is a simple straight thin wire not including phase-shift means in accordance with the invention (corresponding to circuit 17) but relying on distributed inductance and capacitance to provide the phase shifts required. It should be appreciated that while the proper phase shifts do result in this arrangement (as they must if amplification is to be achieved), the efficiency of amplification is not as great as is possible with full utilization of the invention. Thus, here the inherent characteristics of the wire 13' are accepted and the means 22' is designed in view of these characteristics. This results in a lowered impedance level in the amplifier and a correspondingly lower gain than is possible if a circuit corresponding to 17 of FIG. 1 were included. When a circuit such as 17 is included, the impedance relationships in an amplifier can be adjusted substantially independently of the inherent characteristics with resulting greater gain per stage. The operation of the FIG. 3 amplifier is substantially the same as that of the amplifier of FIG. 1, a plurality of stages such as 14*a* being included to provide the desired degree of amplification. It is not believed that arrangements such as that shown in FIG. 3, which do not fully exploit the invention, can be made as efficient as those fully using the invention, but such design may be desirable in view of cost or other factors and the invention can be practiced using either or both types of circuits as described.

While not illustrated, the principles of this invention can be incorporated in structures utilizing ridged wave guide or other forms of transmission line. In such case, conductors, such as shown in FIG. 1 or FIG. 3, may be completely unidentifiable but this does not affect the applicability of the present teachings.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A stage for a traveling-wave parametric amplifier adapted to operate with an idler frequency much greater than the input signal frequency comprising:

at least one device having a reactance whose magnitude may be varied about a fixed value;

phase-shift means for coupling said device in cascade with other similar devices for providing phase shifts substantially independently at both said input signal frequency and said idler frequency in a single path, for enabling both said input and said idler signals to propagate along a single path with the respective phase shifts necessary to permit amplification in a traveling-wave parametric amplifier;

reactive means coupled to said device for providing, in combination with said fixed value of reactance, resultant impedance levels at both said input and said idler frequencies which are higher than the impedance level of said fixed value of reactance alone;

and pump means coupled to said device for supplying a pump signal.

2. A stage in accordance with claim 1, utilizing as reactance devices a pair of variable capacitance diodes whose capacitance may be varied about a fixed value of capacitance in response to said pump signal, and said diodes have a common connection between one set of opposite terminals, and pump signals are applied to the remaining pair of terminals of said diodes in push-pull relation.

3. A traveling-wave parametric amplifier adapted to operate with an idler frequency much greater than the input signal frequency comprising:

input means for accepting input signals to be amplified;

a plurality of devices each having a reactance whose magnitude may be varied about a fixed value;

a plurality of phase-shift means coupling said devices in cascade with said input means for providing phase shifts between successive devices substantially independently at both said input signal frequency and said idler frequency in a single path, for enabling both said input and idler signals to propagate along said single path and arrive at each successive device with the respective phase shifts necessary to permit parametric amplification;

a plurality of reactive means coupled to said devices for providing, in combination with said fixed value of reactance, resultant impedance levels at both said input and said idler frequencies which are higher than the impedance level of said fixed value of reactance alone;

output means coupled to the opposite end of said cascade arrangement from said input means for making available amplified input signals;

and pump means coupled to said devices for supplying pump signals.

4. A traveling-wave parametric amplifier adapted to operate with an idler frequency at least three times as great as the input signal frequency comprising:

input means for accepting input signals to be amplified;

a plurality of diodes each having a capacitance whose magnitude may be varied about a fixed value by a pump signal;

a plurality of phase-shift means coupling said diodes in cascade with said input means for providing phase shifts between successive diodes substantially independently at both said input signal frequency and said idler frequency in a single path, for enabling both said input and idler signals to propagate along said single path and arrive at each successive diode with the respective phase shifts necessary to permit parametric amplification;

a plurality of reactive means coupled to said diodes for providing, in combination with said fixed value of capacitance resultant impedance levels at both said input and said idler frequencies which are higher than the impedance level of said fixed value of capacitance alone;

output means coupled to the opposite end of said cascade arrangement from said input means for making available amplified input signals;

and pump means coupled to said devices for supplying pump signals.

5. A traveling-wave parametric amplifier in accordance with claim 4, wherein said diodes are arranged in pairs with a common connection between one set of opposite terminals of each pair and pump signals are applied to the free terminals of each pair of diodes in push-pull arrangement.

References Cited by the Examiner

UNITED STATES PATENTS

| | | | |
|---|---|---|---|
| 3,012,203 | 12/61 | Tien | 330—5 |
| 3,040,267 | 6/62 | Seidel | 330—5 |
| 3,045,189 | 7/62 | Engelbrecht | 330—5 |
| 3,076,149 | 1/63 | Knechtli et al. | 330—4 |
| 3,092,782 | 6/63 | Chang | 330—4 |
| 3,096,485 | 7/63 | Chang | 330—4 |

FOREIGN PATENTS

| | | |
|---|---|---|
| 567,285 | 5/58 | Belgium. |

OTHER REFERENCES

Heilmeier: "RCA Review," September 1959, pp. 442–454.

Honey et al.: "IRE Transactions on Microwave Theory and Techniques," May 1960, pp. 351–361.

Kroll: "IBM Technical Disclosure Bulletin," vol. 2, No. 2, August 1959, pp. 55–57.

Lombardo et al.: "Airborne Instruments Laboratory Internal Technical Memorandum No. 15," received in Patent Office March 25, 1959.

Reed: "IRE Transactions on Electron Devices," April 1959, pp. 216–224.

Salzberg et al.: "Proceedings of the IRE," June 1958, p. 1303.

Tien et al.: "Proceedings of the IRE," April 1959, pp. 700–706.

ROY LAKE, *Primary Examiner.*

ELI J. SAX, ARTHUR GAUSS, *Examiners.*